United States Patent
Hwang et al.

(10) Patent No.: US 8,044,577 B2
(45) Date of Patent: Oct. 25, 2011

(54) FULL-COLOR ELECTROLUMINESCENT DISPLAY DEVICE WITH MULTIPLE EMISSION LAYERS AND METHOD OF FABRICATING THE SAME

(75) Inventors: Seok-Hwan Hwang, Suwon-si (KR); Young-Kook Kim, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 1149 days.

(21) Appl. No.: 11/604,715

(22) Filed: Nov. 28, 2006

(65) Prior Publication Data
US 2007/0120453 A1   May 31, 2007

(30) Foreign Application Priority Data

Nov. 30, 2005   (KR) ................ 10-2005-0115982

(51) Int. Cl.
*H05B 33/00* (2006.01)
*H05B 33/14* (2006.01)
*H05B 33/22* (2006.01)

(52) U.S. Cl. .......... 313/506; 313/501; 313/507; 445/24; 445/25

(58) Field of Classification Search .................. None
See application file for complete search history.

(56) References Cited

U.S. PATENT DOCUMENTS

| | | | |
|---|---|---|---|
| 4,769,292 A | 9/1988 | Tang et al. | |
| 6,084,347 A | 7/2000 | Xu et al. | |
| 6,614,176 B2 * | 9/2003 | Kim et al. | 313/506 |
| 2001/0053462 A1 * | 12/2001 | Mishima | 428/690 |
| 2003/0127968 A1 * | 7/2003 | Kuma et al. | 313/503 |
| 2004/0009367 A1 * | 1/2004 | Hatwar | 428/690 |
| 2005/0062407 A1 * | 3/2005 | Suh et al. | 313/504 |
| 2005/0093435 A1 * | 5/2005 | Suh et al. | 313/504 |
| 2007/0001588 A1 * | 1/2007 | Boroson et al. | 313/504 |
| 2007/0103056 A1 * | 5/2007 | Cok | 313/503 |

* cited by examiner

*Primary Examiner* — Anne Hines
*Assistant Examiner* — Tracie Green
(74) *Attorney, Agent, or Firm* — Lee & Morse, P.C.

(57) ABSTRACT

A full-color organic light emitting display device and a method of fabricating the same, including a substrate, at least one color conversion layer, a color filter, and an organic light emitting diode having a lower electrode disposed on the substrate, an upper electrode disposed on the lower electrode, and an organic layer with at least a first emission layer.

17 Claims, 6 Drawing Sheets

FULL-COLOR ELECTROLUMINESCENT DISPLAY DEVICE WITH MULTIPLE EMISSION LAYERS AND METHOD OF FABRICATING THE SAME

BACKGROUND OF THE INVENTION

1. Field of the Invention

The present invention relates to electroluminescent display devices. In particular, the present invention relates to a full-color electroluminescent display device and a method of fabricating the same having a structure providing enhanced blue, green, and red color purity and luminescent efficiency.

2. Description of the Related Art

An electroluminescent (EL) display device is a display device where voltage may be employed in light emitting layers to combine electrons and holes to form images. EL display devices have superior characteristics as compared to other display devices, such as excellent visibility, light weight, wide viewing angle, high color purity, and relatively low power consumption.

An EL display device may include a substrate, a light emitting diode having two electrodes, i.e., pixel electrode and counter electrode, and at least one light-emitting layer. The light-emitting layer may include a hole injection layer (HIL), a hole transport layer (HTL), an emission layer (EML), an electron transport layer (ETL), and an electron injection layer (EIL) arranged sequentially between the pixel electrode and the counter electrode. When voltage is applied between the pixel electrode and the counter electrode, holes may be emitted from the pixel electrode through the HIL and the HTL into the EML, and electrons may be emitted from the counter electrode through the EIL and the ETL into the EML. The holes and electrons may recombine in the EML to generate excitons that emit light, which may be evaluated in terms of its color and luminescent efficiency.

Luminous efficiency may depend on the driving voltage of the light emitting diode, the emission dopant concentration in the light emitting diode, and the life span of the excitons. Accordingly, it may be advantageous, for example, to control the concentration of the emission dopant in order to lower the driving voltage of the light emitting diode and, thereby, increase the luminous efficiency. It may also be advantageous to control the life span of the excitons and their diffusion distance within the EML to further increase the luminous efficiency.

The color of light emitted from the light emitting diode may depend on the specific combination of light emitting layers in the light emitting diode. In particular, a light emitting diode capable of exhibiting natural full-color, i.e., capable of forming pure red, green, and blue light colors, may require a specific configuration of light emitting layers.

For example, in a conventional color conversion matrix (CCM) method, a light emitting diode may include a cyan emission source as a light source with separate red, green, and blue conversion layers to absorb the cyan light and emit red, green, and blue colors, respectively. However, the cyan emission material may have a low lifespan and luminous efficiency, while the overall CCM method may require a complicated manufacturing process.

In another exemplary conventional method, red light emission may be achieved by combining either blue and green organic light emitting diodes or cyan and green organic light emitting diodes having a blue color filter. However, both combinations provide low efficiencies due to insufficient red and blue color emissions, respectively. Further, if the light emitting diodes are inorganic, they may require high voltage application and complicated driving circuits, thereby rendering the manufacturing process long and complicated, and provide low efficiency and luminance as compared to the organic light emitting diodes.

Accordingly, there remains a need to improve the structure of the full-color EL display device in order to provide a device capable of providing a single-color light without forming separate red, green, and blue emission layers having different life spans. More importantly, there exists a need for a full-color EL display device exhibiting pure blue, green, and red coordinates with improved luminescent efficiency.

SUMMARY OF THE INVENTION

The present invention is therefore directed to a full-color electroluminescent (EL) display device and method of producing the same, which substantially overcome one or more of the disadvantages of the related art.

It is therefore a feature of an embodiment of the present invention to provide a full-color EL display device that is capable of displaying pure blue, green, and red color coordinates having improved luminescent efficiency.

It is another feature of an embodiment of the present invention to provide a method of producing a full-color EL display device having an improved structure providing enhanced blue, green, and red color purity and luminescent efficiency.

At least one of the above and other features and advantages of the present invention may be realized by providing an organic light emitting display device, including a substrate, at least one color conversion layer, a color filter, and an organic light emitting diode (OLED) having a lower electrode, an upper electrode, and an organic layer with at least a first emission layer, wherein the organic layer may be interposed between the lower and upper electrodes. The organic layer may also include a second emission layer.

The first emission layer of the organic layer may include a material capable of emitting blue light, and the second emission layer of the organic layer may include a material capable of emitting green light. Further, the first emission layer may have a thickness of from about 100 to about 200 angstroms, while the second emission layer may have a thickness of from about 150 to about 300 angstroms.

The OLED may be capable of emitting cyan light. In particular, the OLED may be capable of emitting cyan light in a spectrum half bandwidth of about 80 nm or less. The OLED may be capable of emitting cyan light having a maximum emission wavelength of about 420 nm to about 500 nm. In other words, the OLED may display light having color coordinates of from about (0.12, 0.15) to about (0.20, 0.30).

The organic light emitting display device of the present invention may further include a transparent protective layer disposed on the upper electrode. Additionally, the organic light emitting display device of the present invention may include an over-coating layer disposed on the at least one color conversion layer and the color filter.

In another aspect of the present invention, there is provided a method of fabricating an organic light emitting display device, including obtaining a substrate, forming an OLED having a lower electrode, an upper electrode, and at least a first emission layer, affixing the OLED to the substrate, depositing at least one color conversion layer on the upper electrode of the OLED, and depositing a color filter on the upper electrode of the OLED at a predetermined position.

Forming the OLED may include depositing a second emission layer onto the first emission layer. As such, the first emission layer may be formed to a thickness of about 100 to about 200 angstroms, and the second emission layer may be formed to a thickness of about 150 to about 300 angstroms. Additionally, forming the OLED may include employing a material capable of emitting cyan light.

Depositing the color filter on the upper electrode may include depositing the color filter onto a same layer as the at least one color conversion layer. Further, depositing the color filter at a predetermined position may include depositing the color filter in a blue pixel region of the substrate, while depositing the at least one color conversion layer may include depositing a red conversion layer in a red pixel region of the substrate and a green conversion layer in a green pixel region of the substrate.

The inventive method of the present invention may further include forming a transparent protective layer on the upper electrode of the OLED. Additionally, the method may include forming an over-coating layer on the at least one color conversion layer and the color filter.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
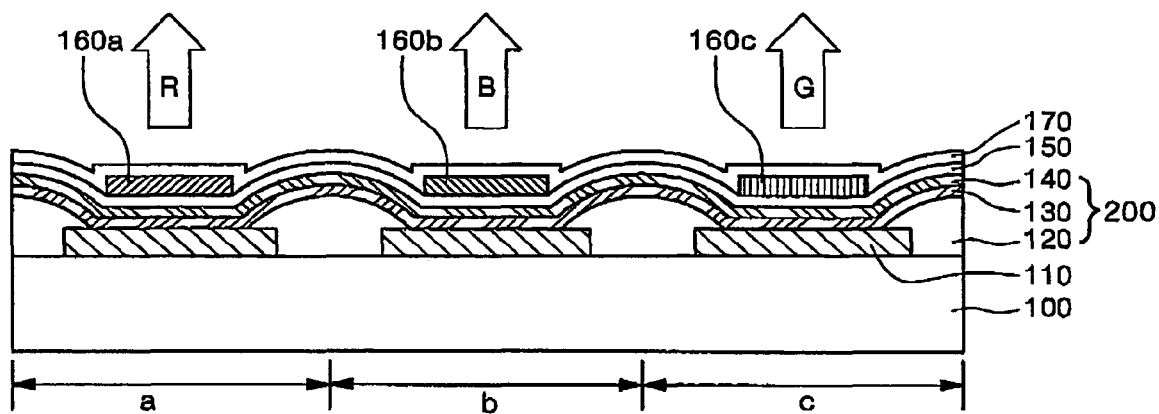
FIG. 1 illustrates a cross-sectional view of an organic light emitting display device according to an embodiment of the present invention.

Korean Patent Application No. 10-2005-0115982, filed on Nov. 30, 2005, in the Korean Intellectual Property Office, and entitled: "Full-Color Organic Light Emitting Display Device and Method of Fabricating the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, or one or more intervening layers may also be present. In addition, it will also be understood that when a layer is referred to as being "between" two layers, it can be the only layer between the two layers, or one or more intervening layers may also be present. Like reference numerals refer to like elements throughout.

An exemplary embodiment of a full-color electroluminescent (EL) display device according to the present invention is more fully described below with reference to FIGS. 1-2.

Figure 2:
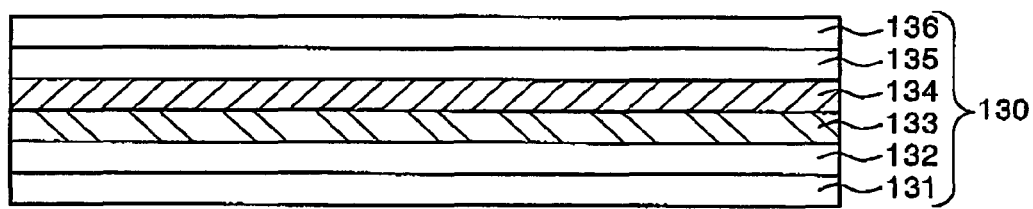
FIG. 2 illustrates a cross-sectional view of an organic layer of the organic light emitting display device illustrated in FIG. 1.

As illustrated in FIGS. 1-2, a full-color EL display device according to an embodiment of the present invention may include a substrate 100, a light emitting diode 200, color conversion layers 160a and 160c, and a color filter 160b.

The substrate 100 of the full-color EL display device according to an embodiment of the present invention may be formed of any material known in the art that exhibits mechanical strength, thermal stability, transparency, surface flatness, ease of handling, and water resistance, such as glass, synthetic resin, stainless steel, and so forth. Further, the substrate 100 may be formed to include three separate regions, i.e., a red pixel region a, a blue pixel region b, and a green pixel region c, as illustrated in FIG. 1.

The light emitting diode 200 of the full-color EL display device according to an embodiment of the present invention may include a lower electrode 110 disposed on the substrate 100, an upper electrode 140 disposed on the lower electrode 110, and an organic layer 130 interposed therebetween. The organic layer 130 may include at least one emission layer (EML). The light emitting diode 200 of the present invention is preferably an organic light emitting diode (OLED). Accordingly, the light emitting diode 200 will be referred hereinafter as OLED 200. However, other types of light emitting diodes are not excluded from the scope of the present invention.

The lower electrode 110 of the OLED 200 may be formed on an upper surface of the substrate 100 by any one of vapor phase deposition, e.g., a sputtering process, an evaporation process, and so forth, ion beam deposition, electron beam deposition, or laser ablation. In particular, the lower electrode 110 may be discontinuous, such that it may include three separate portions corresponding to the separate regions of the substrate 100. In other words, each separate portion of the lower electrode 110 may be applied to the red pixel region a, the blue pixel region b, and the green pixel region c of the substrate 100, respectively, as illustrated in FIG. 1.

The lower electrode 110 may be a transparent electrode or a reflective electrode. Further, the lower electrode 110 may be an anode, thereby further including at least one thin film transistor (TFT). If the lower electrode 110 is a transparent electrode, it may be formed of any one of indium tin oxide (ITO), indium zinc oxide (IZO), zinc oxide (ZnO), or tin oxide (TO). If the lower electrode 110 is a reflective electrode, it may be formed of a single layer, i.e., first layer, of silver (Ag), aluminum (Al), nickel (Ni), platinum (Pt), palladium (Pd), or an alloy thereof, or it may be formed of a double layer having a transmissive oxide layer, e.g., ITO, IZO, TO, ZnO, or an alloy thereof, applied to the first layer, such that the first layer may reflect light emitted from the organic layer 130 away from the substrate 100.

The upper electrode 140 of the OLED 200 may be formed as a cathode on an upper surface of the organic layer 130. The upper electrode 140 may be a transparent electrode or a reflective electrode. If the upper electrode 140 is a transparent electrode, it may be formed to have a relatively small thickness in order to transmit light emitted from the OLED 200. In particular, the upper electrode 140 may be formed of any conductive metal having a low work function, such as magnesium (Mg), calcium (Ca), aluminum (Al), silver (Ag), or an alloy thereof. If the upper electrode 140 is a reflective electrode, i.e., bottom-emission structure, it may be formed to have a relatively high thickness in order to reflect light emitted from the OLED 200. Alternatively, the upper electrode 140 may be formed in a dual-emission structure to operate as a transmissive electrode.

The organic layer 130 of the OLED 200 may be disposed between the lower electrode 110 and the upper electrode 140, and it may include at least two emission layers (EMLs). In particular, the organic layer 130 may include at least a first EML 133 and a second EML 134. Additionally, as illustrated in FIG. 2, the organic layer 130 may include additional functional layers, such as a hole injection layer (HIL) 131, a hole transport layer (HTL) 132, an electron transport layer (ETL) 135, and an electron injection layer (EIL) 136. All the layers included in the organic layer 130 may be applied sequentially to the lower electrode 110, having the first and second EML 133 and 134 interposed sequentially between the HTL 132 and the ETL 135. However, it should be noted that according to an embodiment of the present invention, the organic layer 130 may include any suitable number of each of the functional layers listed above as may be determined by one of ordinary skill in the art.

In particular, the HIL 131 may be disposed on an upper surface of the lower electrode 110 by any method known in the art, such as vacuum evaporation, spin coating, ink-jet, and so forth. The HIL 131 may facilitate injection of holes into the first and second EMLs 133 and 134, and it may be formed of a low-molecular weight material, such as copper phthalocyanine (CuPc); 4,4',4"-tris-(N-(1-naphthyl)-N-phenyl-amino)-triphenylamine (TNATA); 4,4',4"-tris-(N-carbazolyl)triphenylamine (TCTA); 1,3,5-tris-(N,N-bis(4,5-methoxyphenyl)aminophenyl)benzene (TDAPB); 4,4',4"-tris(N,N-diphenyl-amino)-triphenylamine (TDATA); and like material, or of a polymer material, such as polyaniline (PANI), poly-(3,4)-ethylenedioxythiophene (PEDOT), and so forth.

The HTL 132 may be disposed on an upper surface of the HIL 131 by any method known in the art, such as vacuum evaporation, spin coating, ink-jet, and so forth. The HTL 132 may facilitate transport of holes from the HIL 131 into the first and second EMLs 133 and 134, and it may be formed of a low-molecular weight material, such as N,N'-dinaphthyl-N,N'-diphenyl benzidine (NPD); N,N'-bis-(3-methylphenyl)-N,N'-bis-(phenyl)-benzidine (TPD); 2,2,7,7-tetrakis-(N,N-diphenylamine)-9,9-spirobi-fluorene (s-TAD); 4,4',4"-Tris (N-3-methylphenyl-N-phenyl-amino)-triphenylamine (MTDATA), and like material, or of a polymer material, such as poly-vinylcarbazole (PVK).

The first and second EMLs 133 and 134 may be sequentially applied to an upper surface of the HTL 132 by vacuum evaporation, e.g., using a fine metal mask, spin coating, casting, ink-jet printing, or laser induced thermal imaging (LITI). Preferably, the first and second EMLs 133 and 134 may be formed by vacuum evaporation, thereby providing uniform and substantially continuous, i.e., significantly reduced number of pinholes, films.

The first and second EMLs 133 and 134 may be formed of any phosphorescent or fluorescent material capable of emitting blue or green lights. In particular, as long as the first and second EMLs 133 and 134 emit both green and blue light, they may be formed of any material. For example, if the first EML 133 includes a blue light emitting material, the second EML 134 may be applied to an upper surface of the first EML 133 and formed of a green light emitting material. Similarly, if the first EML 133 includes a green light emitting material, the second EML 134 may be applied to the upper surface of the first EML 133 and formed of a blue light emitting material.

In particular, if a fluorescent material is used to form either of the EMLs, any one of 8-trishydroxyquinoline aluminum (Alq3); distyrylarylene (DSA) and/or its derivatives; distyrylbenzene (DSB) and/or its derivatives; 4,4'-bis(2,2'-diphenyl vinyl)-1,1'-biphenyl (DPVBi) and/or its derivatives such as spiro-DPVBi; spiro-6P(spiro-para-hexaphenyl); IDE 140 (Idemitsu Co., Ltd.) or any other suitable material may be used. Further, a fluorescent EML may include a dopant material, such as styrylamine, pherylene, distyrylbiphenyl (DSBP), and so forth, incorporated into a fluourescent host material. For example, the EML may include a blue fluorescent dopant material, such as IDE102 (Idemitsu Co., Ltd.) or IDE105 (Idemitsu Co., Ltd.), or a green fluorescent dopant material, such as C545T (Hayashibara Int.). The concentration of the dopant material may be determined by one of ordinary skill in the art with respect to the type of material and processing requirement. However, the concentration of the dopant material in its host material may range from about 0.01% to about 15% by weight.

Alternatively, if a phosphorescent material is used to form either of the EMLs, any one of arylamine, carbazol, or spiro may be used. Preferably, the EML may be formed of 4,4-N,N dicarbazole-biphenyl (CBP) and/or its derivatives; N,N-dicarbazolyl-3,5-benzene (mCP) and/or its derivatives; or spiro derivatives. Further, a phosphorescent EML may include a phosphorescent organic metal complex having one central metal as a dopant material, e.g., iridium (Ir), plutonium (Pt), terbium (Tb), europium (Eu). The phosphorescent dopant, i.e., organic metal complex, may be one of iridium (III) bis (2-phenyl quinolyl) acetylacetonate (PQIr); PQIr(acac), PQ$_2$Ir(acac), PIQIr(acac), and Pt(II) Octaethyl-porphine (PtOEP).

The ETL 135 may be disposed on an upper surface of the EML, e.g., upper surface of the second EML 134, by vacuum evaporation, spin coating, ink-jet printing, or LITI to facilitate transport of electrons to the first and second EMLs 133 and 134. The ETL 135 may be formed of, for example, a polymer material, such as probenecid (PBD), TAZ, or spiro-PBD, or a small molecule material, such as Alq3, bis-(2-methyl-8-quinolinolato)(4-phenylphenolato)-aluminum(III) (Balq), or bis-(2-methyl-8-quinolinolato)-triphenylsilanolato-aluminum (Salq).

The EIL 136 may be disposed on an upper surface of the ETL 135 by vacuum evaporation, spin coating, ink-jet printing, or LITI to facilitate injection of electrons into the first and second EMLs 133 and 134. The EIL 136 may be formed of any one of Alq3, lithium fluoride (LiF), Ga complexes, or PBD.

The organic layer 130 may also include a hole blocking layer (not shown). The hole blocking layer (HBL) may be disposed on the first and second EMLs 133 and 134 to inhibit diffusion of excitons generated in the first and second EMLs 133 and 134 during the drive of the OLED 200. The HBL may be formed of Balq; 2,9-dimethyl-4,7-diphenyl-1,10-phenanthroline (BCP); fluorobenzene-based compound, such as CF—X; 1,2,4-triazole derivative (TAZ) or spiro-TAZ, and so forth. However, the HBL may be omitted if the first and second EMLs 133 and 134 are formed of fluorescent materials.

The OLED 200 of the present invention may further include a pixel defining layer 120 applied discontinuously to an upper surface of the substrate 100 between the separate portions of the lower electrode 110 by a photolithography process, i.e., a process that may involve an exposure process and a developing process. In other words, the pixel defining layer 120 may be applied to the substrate 100 and patterned, such that it may fill the spaces between the separate portions of the lower electrode 110. In particular, it may cover peripheral portions of an upper surface of each of the separate electrodes 110, while partially exposing a center portion of the upper surface of each separate electrode 110, as illustrated in FIG. 1. The pixel defining layer 120 may be formed of any one of polyimide, benzocyclobutene resin, phenol resin, acrylate, and so forth.

The color conversion layers 160a and 160c of the full-color EL display device according to an embodiment of the present may be disposed on the OLED 200 by way of LITI, and they may contain a fluorescent material and a polymer binder. In particular, each color conversion layer 160a and 160c may contain a predetermined fluorescent material in order to absorb light emitted from the EMLs and generate fluorescence to emit a specific wavelength of light.

More specifically, a red color conversion layer 160a and a green color conversion layer 160c may be formed in areas corresponding to the red pixel region a and the green pixel region c of the substrate 100, respectively. For example, when a red color conversion layer 160a is formed in an area corresponding to the red pixel region a of the substrate 110, it may absorb the incident light emitted from the first and second EMLs 133 and 134 as an excitation light source and generate fluorescence having a longer wavelength than the incident light, i.e., transition from an excited state to a ground state, to emit red light.

The red and green color conversion layers 160a and 160c may be formed as follows. A donor film (not shown) including a base layer (not shown) and a color transfer layer (not shown) may be applied to a substrate (not shown), such that the color transfer layer is in direct communication with the substrate. Next, a laser beam may be radiated onto the base film of the donor film to transfer the color transfer layer onto the substrate due to the emitted energy to form the color conversion layers 160a and 160c.

Without intending to be bound by theory, it is believed that such formation of the color conversion layers 160a and 160c may provide shorter processing time and improved color definition as compared to other conventional processing methods, e.g., formation of a color filter by way of photolithography that may involve repetitive exposure and development processing or vacuum evaporation.

The color filter 160b of the full-color EL display device according to an embodiment of the present may be disposed on the OLED 200 by way of LITI, and it may contain a pigment and a polymer binder. In particular, the color filter 160b may contain a predetermined pigment in order transmit a specific wavelength of light emitted from the EML and, thereby, control the color of light observed, e.g., red color filter, blue color filter, and so forth.

More specifically, a color filter 160b having a blue pigment may be formed in the blue pixel region b, and the first and second EMLs 133 and 134 may include phosphorescent or fluorescent materials emitting blue and green lights, as previously discussed with respect to the OLED 200. Accordingly, the color filter 160b characterized by a blue filter may absorb all light emitted from the first and second EMLs 133 and 134 except light in the blue wavelength region, such that only the blue light may be observed.

The blue color filter 160b may be formed in a similar way to the color conversion layers 160a and 160c. A donor film including a base layer, a light-to-heat conversion (LTHC) layer, and a color transfer layer may be applied to a substrate, such that the color transfer layer is in direct communication with the substrate. Next, a laser beam may be radiated onto the base film of the donor film, such that the LTHC layer may absorb light from the laser beam and emit it through the color transfer layer into the substrate. In the process, the color transfer layer may be transferred onto the substrate due to the emitted energy to form the color filter 160b, thereby providing the same advantages listed with respect to the method of preparation of the color conversion layers 160a and 160c.

The full-color EL display device according to an embodiment of the present invention may further include a transparent protective layer 150 and an over-coating layer 170. The transparent protective layer 150 may be disposed on an upper surface of the upper electrode 140, such that the color filter 160b and the color conversion layers 160a and 160c may be disposed thereon. The transparent protective layer 150 may be formed of an inorganic layer, e.g., ITO, IZO, silicate oxide ($SiO_2$), silicate nitride ($SiN_x$), yttrium oxide ($Y_2O_3$), and aluminum oxide ($Al_2O_3$), an organic layer, e.g., parylene or high-density-polyethylene (HDPE), or a combination thereof.

The over-coating layer 170 may be a transparent layer formed on the substrate 100. In particular, the over-coating layer 170 may be formed above the transparent protective layer 150 in order to enclose the color filter 160b and/or the color conversion layers 160a and 160c therebetween, such that the over-coating layer 170 may prevent the color filter 160b and/or the color conversion layers 160a and 160c from being physically damaged and relieve the step height generated due to the color filter 160b and/or the color conversion layers 160a and 160c.

Hereinafter, experimental examples illustrating the emission spectrum and the quality and optical characteristics of the color filter 160b and color conversion layers 160a and 160c of the present invention are provided. However, the following examples are not excluding from the scope of the present invention any other embodiments.

Example 1

A 15 $\Omega/cm^2$ (1200 Å) ITO glass substrate (Corning) having an anode electrode as a lower electrode was cut to a size of 50 mm×50 mm×0.7 mm, cleaned in an ultrasonic bath containing isopropyl alcohol and pure water for 5 minutes, irradiated with ultraviolet (UV) light for 30 minutes, and then exposed to ozone ($O_3$) for cleaning. Subsequently, the prepared ITO glass substrate was loaded into a vacuum evaporation apparatus.

Next, IDE 406 (Idemitsu Kosan Co., Ltd.) was vacuum-deposited to a thickness of 600 angstroms onto the glass substrate to form a HIL and 4,4'-bis[N-(1-naphthyl-1-)-N-phenyl-amino]-biphenyl (NPB) was vacuum-deposited to a thickness of 200 angstroms to form a HTL. Subsequently, IDE140 and IDE105 (Idemitsu Kosan Co., Ltd.) were mixed at a weight ratio of about 98:2 and applied to the HTL to have a thickness of 150 angstroms to form a first EML capable of emitting blue light. Next, IDE 140 and C545T (Hayashibara) were mixed at a weight ratio of about 98:2 and applied to the first EML to have a thickness of 150 angstroms to form a second EML capable of emitting green light. Finally, Alq3 and LiF were deposited sequentially onto the second EML to have respective thicknesses of 300 and 10 angstroms to form an ETL and EIL, respectively. Aluminum was vacuum-deposited to have a thickness of 3000 angstroms onto the EIL to form a cathode electrode and complete the OLED structure.

Figure 3:
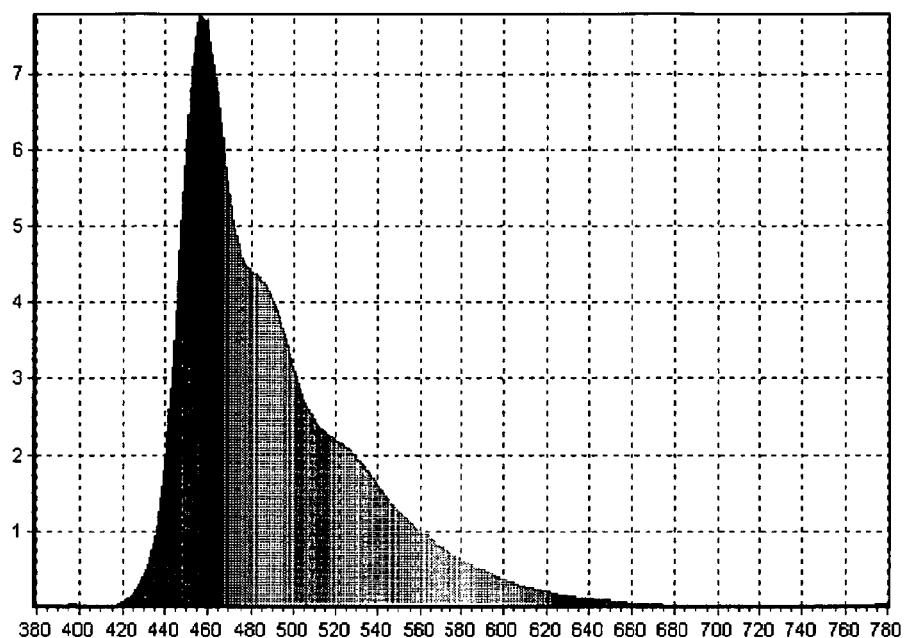
FIG. 3 illustrates a graph of an emission spectrum of light emitted from an OLED formed according to an embodiment of the present invention described in Example 1.

The luminance of the OLED of Example 1 was measured as 1306 cd/m$^2$, while its luminous efficiency was measured as 6.53 cd/A at a voltage of 6.5 V. The color coordinates of the OLED were determined to be (0.172, 0.220) on the color scale of the Commission Internationale de l'Eclairage (CIE). In an emission spectrum shown in FIG. 3, the spectral half bandwidth was about 46 nm. In this respect, it is noted that half band width refers to the width of a spectral band, i.e., emission intensity, at a height equal to half of its maximum height.

Next, a color filter was applied to the OLED. In particular, polyvinyl chloride resin having a molecular weight of 45,000 and containing 5 wt % of blue color filter material (Dongwoo Fine-Chem Co., Ltd.) was dissolved in cyclohexanone to obtain ink having a solid content of 25%. Subsequently, the obtained ink was spin-coated onto the OLED and dried at a temperature of 80° C. for 1 hour to form a blue OLED having a blue color filter with a film thickness of about 17 to about 18 μm.

The blue OLED exhibited luminance of 599 cd/m$^2$, luminous efficiency of 3.0 cd/A at a voltage of 6.5 V, and had CIE color coordinates of x=0.140 and y=0.135, which confirmed blue emission.

Example 2

An OLED was formed according to the procedure outlined in Example 1, except that a green color conversion layer, as opposed to a blue color filter, was applied to the OLED. In particular, polyvinyl chloride resin having a molecular weight of 45,000 and containing 0.5 wt % of coumarine 6 was dissolved in cyclohexanone to obtain ink having a solid content of 25%. Subsequently, the obtained ink was spin-coated onto the OLED and dried at a temperature of 80° C. for 1 hour to form a green OLED having a green color conversion layer with a film thickness of about 17 to about 18 μm.

The green OLED exhibited luminance of 1431 cd/m$^2$, luminous efficiency of 7.16 cd/A at a voltage of 6.5 V, and had CIE color coordinates of x=0.271 and y=0.630, which confirmed green emission.

Example 3

An OLED was formed according to the procedure outlined in Example 1, except that a red color conversion layer, as opposed to a blue color filter, was applied to the OLED. In particular, polyvinyl chloride resin having a molecular weight of 45,000 and containing 0.5 wt % of coumarine 6, 0.5 wt % of rhodamine 6G, and 0.5 wt % of rhodamineB was dissolved in cyclohexanone to obtain ink having a solid content of 25%. Subsequently, the obtained ink was spin-coated onto the OLED and dried at a temperature of 80° C. for 1 hour to form a red OLED having a red color conversion layer with a film thickness of about 17 to about 18 μm.

The red OLED exhibited luminance of 437 cd/m$^2$, luminous efficiency of 2.19 cd/A at a voltage of 6.5 V, and had CIE color coordinates of x=0.622 and y=0.368, which confirmed red emission.

Example 4

An OLED was formed according to the procedure outlined in Example 1, except that the first EML (blue) was deposited to have a thickness of 150 angstroms and the second EML (green) was deposited to have a thickness of 200 angstroms.

Figure 4:
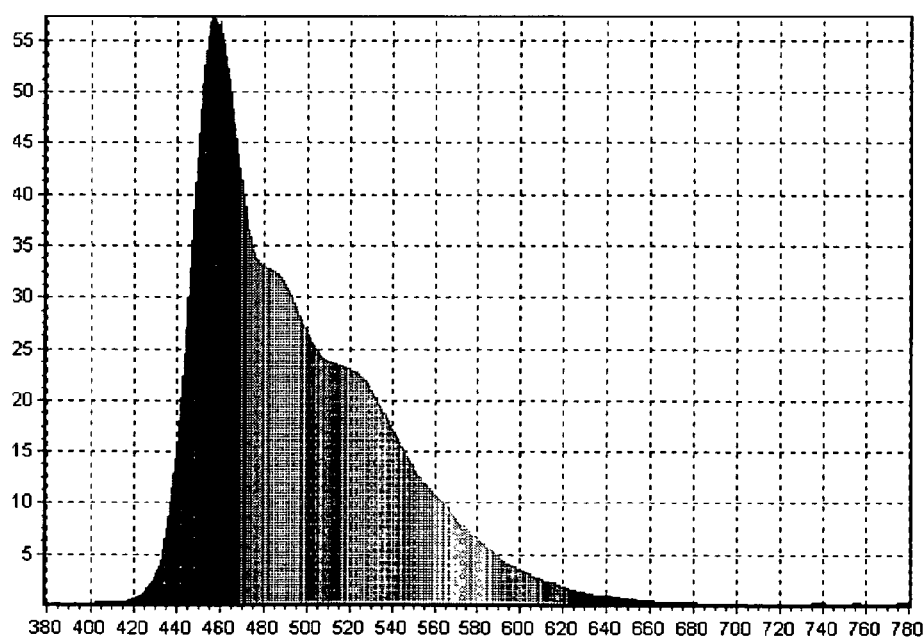
FIG. 4 illustrates a graph of an emission spectrum of light emitted from an OLED formed according to an embodiment of the present invention described in Example 4.

Accordingly, the luminance of the OLED of Example 4 was measured as 1594 cd/m$^2$, while its luminous efficiency was measured as 7.97 cd/A at a voltage of 6.5 V. The color coordinates of the OLED were determined to be (0.174, 0.241) on the CIE scale. In an emission spectrum shown in FIG. 4, the spectrum half bandwidth was about 51 nm.

Figure 5:
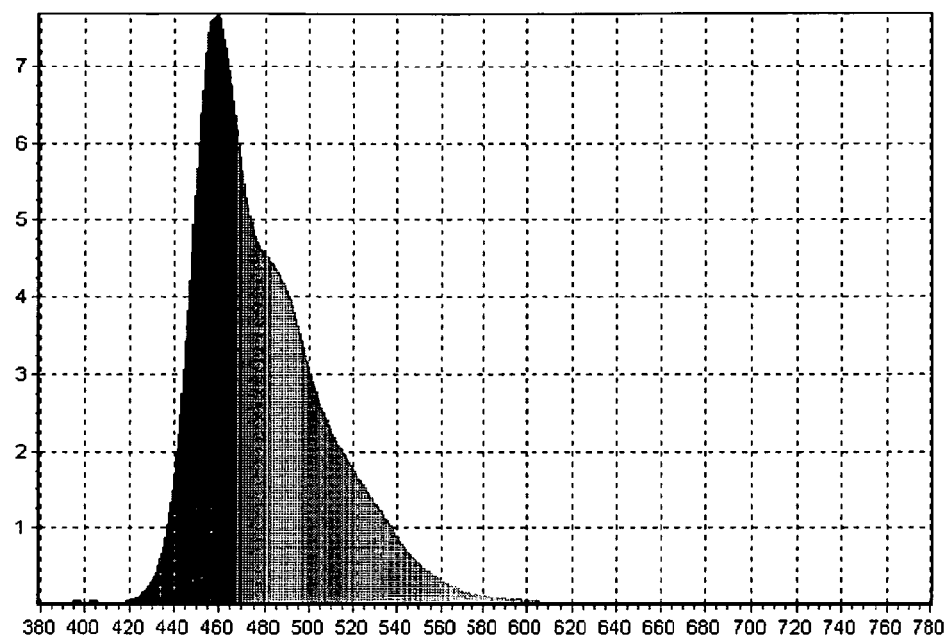
FIG. 5 illustrates a graph of an emission spectrum of blue light transmitted through a blue color filter formed on an OLED according to an embodiment of the present invention described in Example 4.

Next, a blue color filter was applied to the OLED in the same way outlined in Example 1. The blue OLED exhibited luminance of 842 cd/m$^2$, luminous efficiency of 4.21 cd/A at a voltage of 6.5 V, and had CIE color coordinates of x=0.143 and y=0.161, which confirmed blue emission. The emission spectrum of blue light transmitted through the blue color filter is illustrated in FIG. 5.

Example 5

An OLED was formed according to the procedure outlined in Example 4, except that a green color conversion layer according to the procedure outlined in Example 2, as opposed to a blue color filter, was applied to the OLED.

Figure 6:
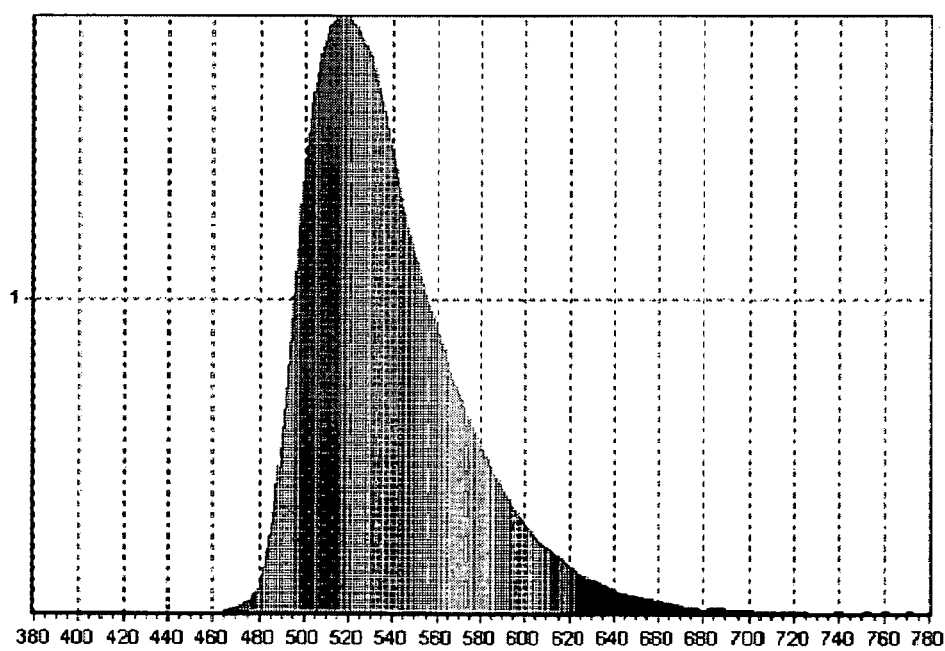
FIG. 6 illustrates a graph of an emission spectrum of green light transmitted through a green color conversion layer formed on an OLED according to an embodiment of the present invention described in Example 5.
Figure 7:
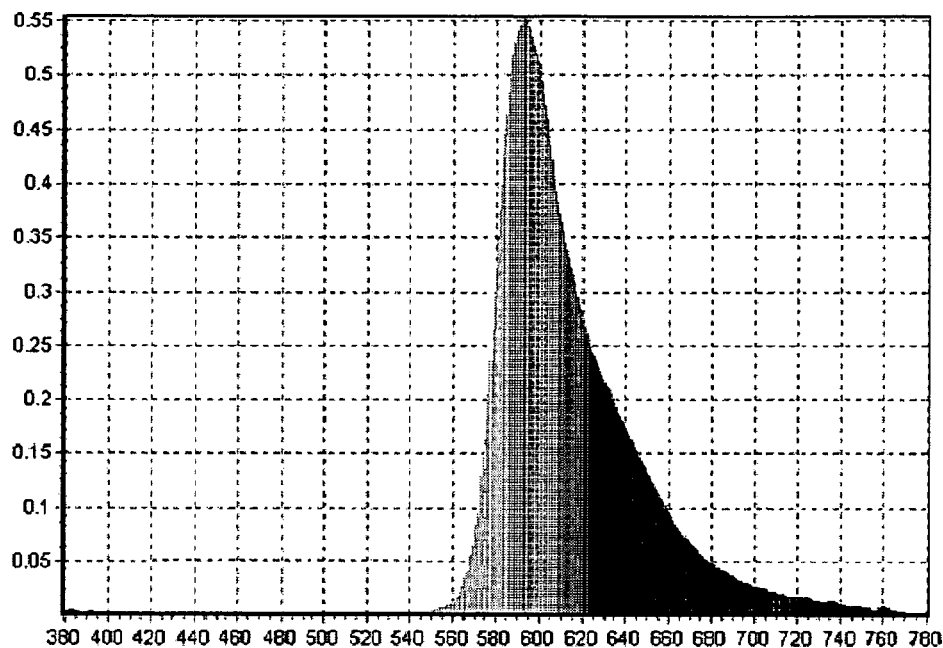
FIG. 7 illustrates a graph of an emission spectrum of red light transmitted through a red color conversion layer formed on an OLED according to an embodiment of the present invention described in Example 6.

The green OLED exhibited luminance of 1702 cd/m$^2$, luminous efficiency of 8.51 cd/A at a voltage of 6.5 V, and had CIE color coordinates of x=0.272 and y=0.652, which confirmed green emission. The emission spectrum of green light transmitted through the green color conversion layer is illustrated in FIG. 6.

Example 6

An OLED was formed according to the procedure outlined in Example 4, except that a red color conversion layer according to the procedure outlined in Example 3, as opposed to a blue color filter, was applied to the OLED.

The red OLED exhibited luminance of 519 cd/m$^2$, luminous efficiency of 2.6 cd/A at a voltage of 6.5 V, and had CIE color coordinates of x=0.628 and y=0.366, which confirmed red emission. The emission spectrum of red light transmitted through the red color conversion layer is illustrated in FIG. 6.

Example 7

An OLED was formed according to the procedure outlined in Example 1, except that the first EML (blue) was deposited to have a thickness of 100 angstroms and the second EML (green) was deposited to have a thickness of 200 angstroms.

Figure 8:
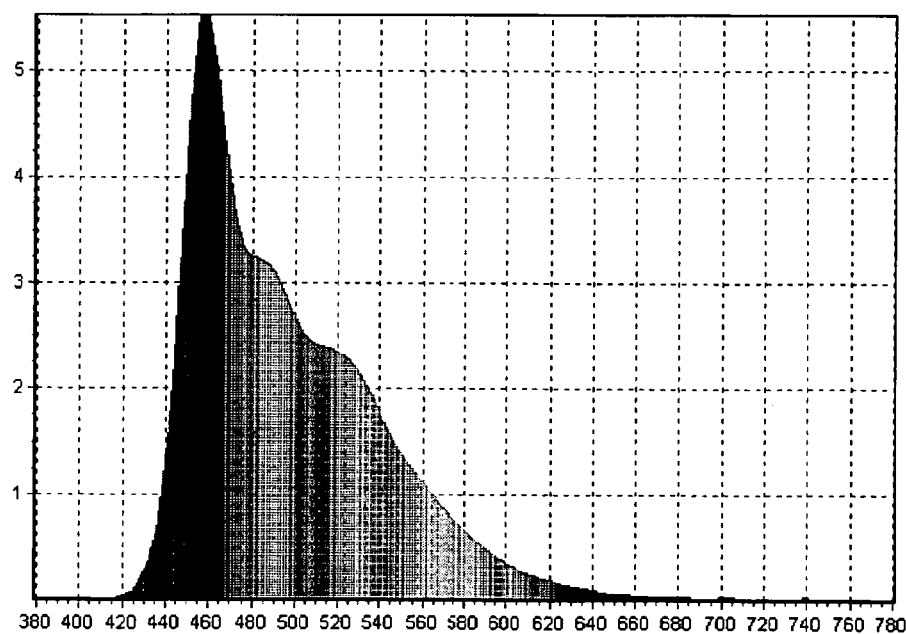
FIG. 8 illustrates a graph of an emission spectrum of light emitted from an OLED formed according to an embodiment of the present invention described in Example 7.

Accordingly, the luminance of the OLED of Example 7 was measured as 1690 cd/m$^2$, the luminous efficiency was determined as 8.45 cd/A at a voltage of 6.5 V, and the OLED had CIE color coordinates of x=0.186 and y=0.268. In an emission spectrum shown in FIG. 8, the spectrum half bandwidth was 54 nm.

Next, a blue color filter was applied to the OLED in the same way outlined in Example 1. The blue OLED exhibited luminance of 820 cd/m$^2$ and luminous efficiency of 4.1 cd/A at a voltage of 6.5 V and had CIE color coordinates of x=0.144 and y=0.173, which confirmed blue emission.

Example 8

An OLED was formed according to the procedure outlined in Example 7, except that a green color conversion layer according to the procedure outlined in Example 2, as opposed to a blue color filter, was applied to the OLED.

The green OLED exhibited luminance of 1817 cd/m$^2$ and luminous efficiency of 9.09 cd/A at a voltage of 6.5 V and had CIE color coordinates of x=0.277 and y=0.644, which confirmed green emission.

Example 9

An OLED was formed according to the procedure outlined in Example 7, except that a red color conversion layer according to the procedure outlined in Example 3, as opposed to a blue color filter, was applied to the OLED.

The red OLED exhibited luminance of 510 cd/m$^2$ and luminous efficiency of 2.55 cd/A at a voltage of 6.5 V and had CIE color coordinates of x=0.617 and y=0.367, which confirmed red emission.

Example 10

Figure 9:
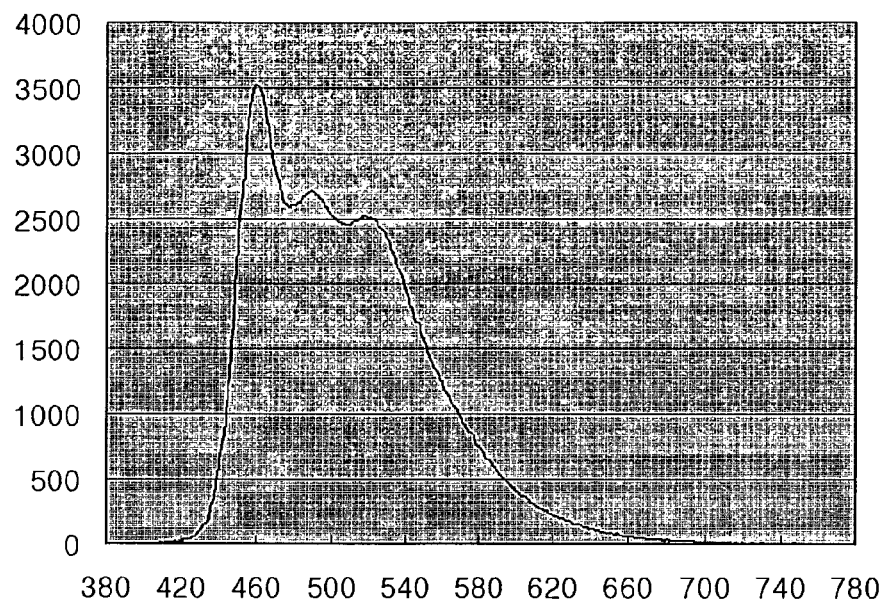
FIG. 9 illustrates a graph of an emission spectrum of light emitted from an OLED formed according to an embodiment of the present invention described in Example 10.

An OLED was formed according to the procedure outlined in Example 1, except that the first EML (blue) was deposited to have a thickness of 70 angstroms and the second EML (green) was deposited to have a thickness of 280 angstroms. Accordingly, the OLED of Example 10 exhibited luminance of 2040 cd/m$^2$, luminous efficiency of 10.20 cd/A at a voltage of 6.5 V, and had CIE color coordinates of x=0.204 and y=0.349. In an emission spectrum shown in FIG. 9, the spectrum half bandwidth was 98 nm.

Next, a blue color filter was applied to the OLED in the same way outlined in Example 1. The blue OLED exhibited a luminance of 807 cd/m$^2$, luminous efficiency of 4.04 cd/A at a voltage of 6.5 V, and had CIE color coordinates of x=0.141 and y=0.224, which confirmed blue emission.

Example 11

An OLED was formed according to the procedure outlined in Example 10, except that a green color conversion layer according to the procedure outlined in Example 2, as opposed to a blue color filter, was applied to the OLED.

The green OLED exhibited a luminance of 2135 cd/m$^2$, a luminous efficiency of 10.68 cd/A at a voltage of 6.5 V, and had CIE color coordinates of x=0.278 and y=0.637, which confirmed green emission.

Example 12

An OLED was formed according to the procedure outlined in Example 10, except that a red color conversion layer according to the procedure outlined in Example 3, as opposed to a blue color filter, was applied to the OLED.

The red OLED exhibited a luminance of 463 cd/m$^2$, luminous efficiency of 2.32 cd/A at a voltage of 6.5 V, and had CIE color coordinates of x=0.598 and y=0.387, which confirmed red emission.

Example 13

Figure 10:
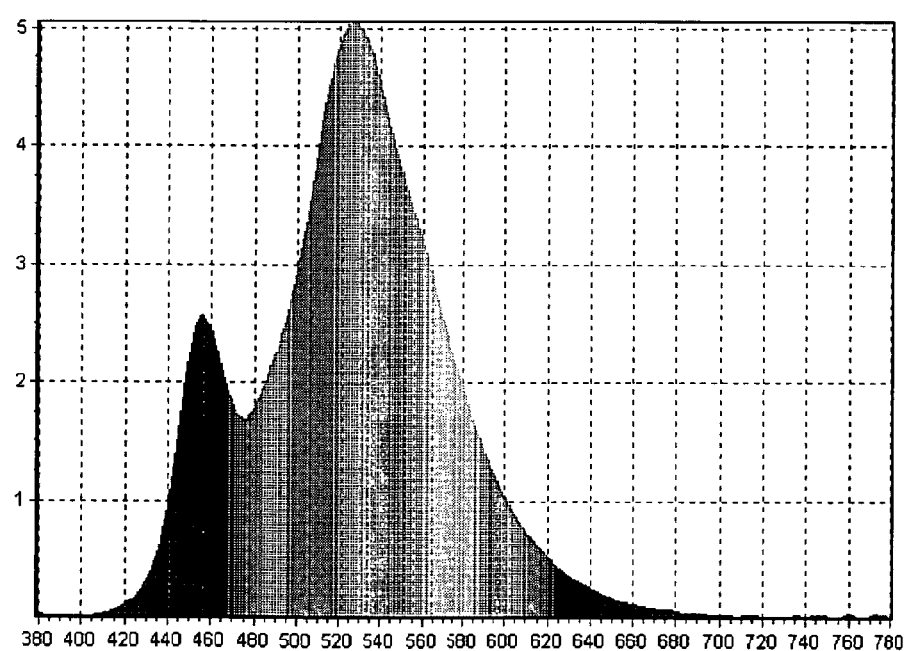
FIG. 10 illustrates a graph of an emission spectrum of light emitted from an OLED formed according to an embodiment of the present invention described in Example 13.

An OLED was formed according to the procedure outlined in Example 1, except that the first EML (blue) was deposited to have a thickness of 50 angstroms and the second EML (green) was deposited to have a thickness of 300 angstroms. Accordingly, the OLED of Example 13 exhibited luminance of 2057 cd/m$^2$ and luminous efficiency of 10.29 cd/A at a voltage of 6.5 V, and had CIE color coordinates of x=0.260 and y=0.483. In an emission spectrum shown in FIG. 10, the spectrum half bandwidth was 82 nm.

Next, a blue color filter was applied to the OLED in the same way outlined in Example 1, except that the polyvinyl chloride resin contained 5 wt % of blue color filter material (Dongwoo Fine-Chem Co., Ltd.).

The blue OLED exhibited luminance of 356 cd/m$^2$, luminous efficiency of 1.78 cd/A at a voltage of 6.5 V, and had CIE color coordinates of x=0.136 and y=0.252, which confirmed blue emission.

Example 14

An OLED was formed according to the procedure outlined in Example 13, except that a green color conversion layer according to the procedure outlined in Example 2, as opposed to a blue color filter, was applied to the OLED.

The green OLED exhibited luminance of 2114 cd/m$^2$, luminous efficiency of 10.57 cd/A at a voltage of 6.5 V, and had CIE color coordinates of x=0.310 and y=0.648, which confirmed green emission.

Example 15

An OLED was formed according to the procedure outlined in Example 13, except that a red color conversion layer according to the procedure outlined in Example 3, as opposed to a blue color filter, was applied to the OLED.

The red OLED exhibited luminance of 621 cd/m$^2$, luminous efficiency of 3.11 cd/A at a voltage of 6.5 V, and had CIE color coordinates of x=0.564 and y=0.424, which confirmed orange emission.

Example 16

Figure 11:
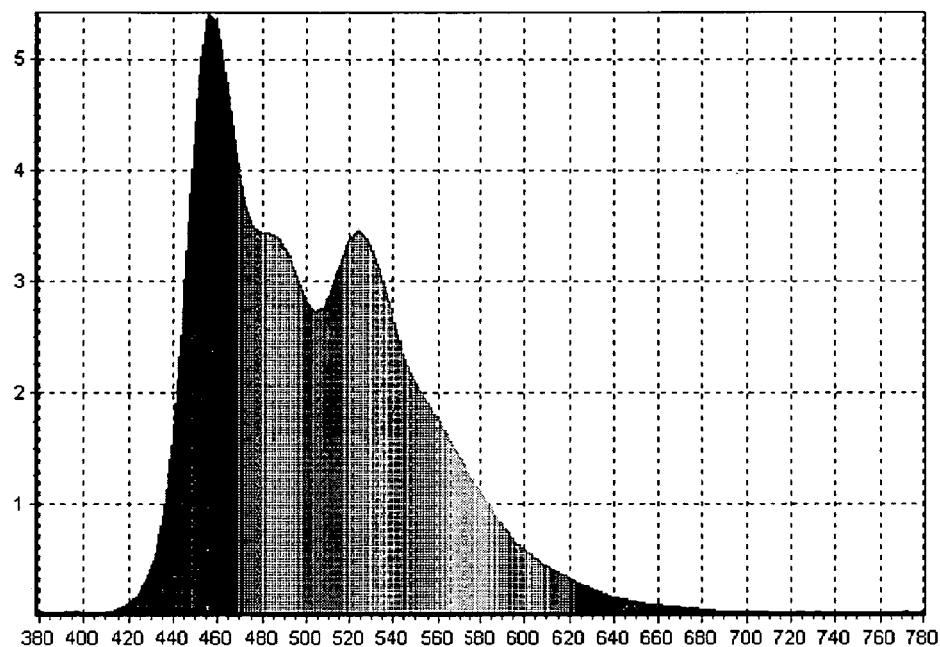
FIG. 11 illustrates a graph of an emission spectrum of light emitted from an OLED formed according to an embodiment of the present invention described in Example 16.

An OLED was formed according to the procedure outlined in Example 1, except that the first EML (blue) was deposited to have a thickness of 200 angstroms and the second EML (green), which contained Alq3 and C545T (Hayashibara) at a weight ratio of about 98:2, was deposited to have a thickness of 200 angstroms. Accordingly, the OLED of Example 16 exhibited luminance of 1157 cd/m$^2$, luminous efficiency of 5.79 cd/A at a voltage of 6.5 V, and had CIE color coordinates of (0.208, 0.321). In an emission spectrum of FIG. 11, the spectrum half bandwidth was 96 nm.

Next, a blue color filter was applied to the OLED in the same way outlined in Example 1. The blue OLED exhibited luminance of 408 cd/m$^2$, luminous efficiency of 2.04 cd/A at a voltage of 6.5 V, and had CIE color coordinates of x=0.143 and y=0.184, which confirmed blue emission.

Example 17

An OLED was formed according to the procedure outlined in Example 13, except that a green color conversion layer according to the procedure outlined in Example 2, as opposed to a blue color filter, was applied to the OLED.

The green OLED exhibited luminance of 1259 cd/m², luminous efficiency of 6.3 cd/A at a voltage of 6.5 V, and had CIE color coordinates of x=0.290 and y=0.636, which confirmed green emission.

Example 18

An OLED was formed according to the procedure outlined in Example 13, except that a red color conversion layer according to the procedure outlined in Example 3, as opposed to a blue color filter, was applied to the OLED.

The red OLED exhibited luminance of 368 cd/m², luminous efficiency of 1.85 cd/A at a voltage of 6.5 V, and had CIE color coordinates of x=0.571 and y=0.405, which confirmed orange emission.

Comparative Example 1

Figure 12:
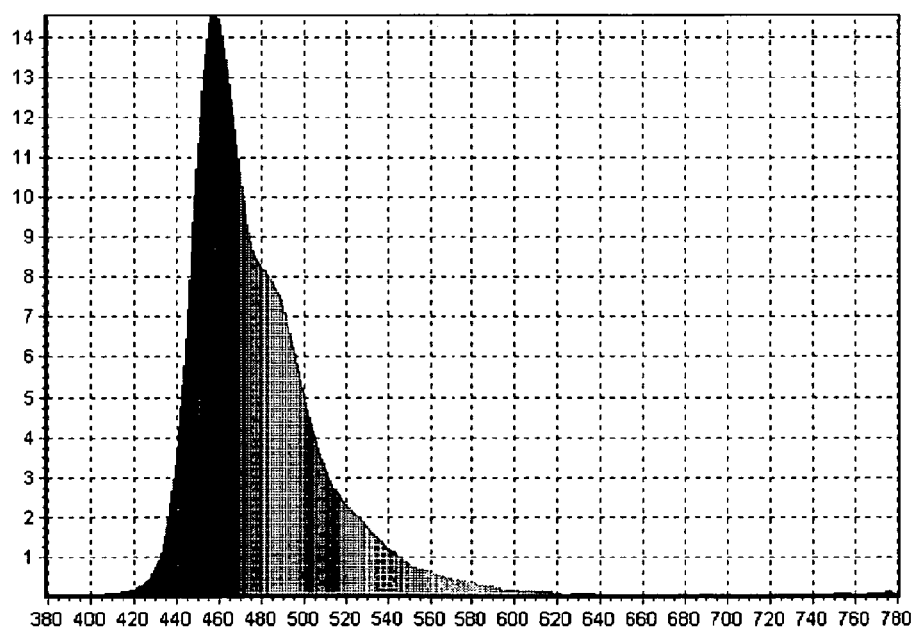
FIG. 12 illustrates a graph of an emission spectrum of light emitted from an OLED formed according to an embodiment of the present invention described in Comparative Example 1.

An OLED was formed according to the procedure outlined in Example 1, except that the first EML (blue) was deposited to a thickness of 300 angstroms. Accordingly, the OLED of Comparative Example 1 exhibited luminance of 934 cd/m², luminous efficiency of 4.67 cd/A at a voltage of 6.5 V, and had CIE color coordinates of (0.147, 0.147). In an emission spectrum shown in FIG. 12, the spectrum half bandwidth was 45 nm. No application of blue color filter was needed in Comparative Example 1 due to good purity of the OLED blue color.

Comparative Example 2

An OLED was formed according to the procedure outlined in Comparative Example 1, except that a green color conversion layer according to the procedure outlined in Example 2 was applied to the OLED.

The green OLED exhibited luminance of 1083 cd/m², luminous efficiency of 5.42 cd/A at a voltage of 6.5 V, and had CIE color coordinates of x=0.236 and y=0.633, which confirmed green emission.

Comparative Example 3

An OLED was formed according to the procedure outlined in Comparative Example 1, except that a red color conversion layer according to the procedure outlined in Example 3 was applied to the OLED.

The red OLED exhibited luminance of 316 cd/m², luminous efficiency of 1.58 cd/A at a voltage of 6.5 V, and had CIE color coordinates of x=0.597 and y=0.385, which confirmed red emission.

The results of Examples 1-18 and Comparative Examples 1-3 are reported in Table 1 below.

TABLE 1

| Light Source | Blue Luminous Efficiency Color Coordinates (x, y) | Green Luminous Efficiency Color Coordinates (x, y) | Red Luminous Efficiency Color Coordinates (x, y) |
| --- | --- | --- | --- |
| Examples 1-3 | 3.0 cd/A (0.140, 0.135) | 7.16 cd/A (0.270, 0.630) | 2.19 cd/A (0.622, 0.368) |
| Examples 4-6 | 4.21 cd/A (0.143, 0.161) | 8.51 cd/A (0.272, 0.652) | 2.6 cd/A (0.628, 0.366) |
| Examples 7-9 | 4.1 cd/A (0.144, 0.173) | 9.09 cd/A (0.277, 0.644) | 2.55 cd/A (0.617, 0.367) |
| Examples 10-12 | 4.04 cd/A (0.141, 0.224) | 10.68 cd/A (0.278, 0.637) | 2.32 cd/A (0.598, 0.387) |
| Examples 13-15 | 1.78 cd/A (0.136, 0.252) | 10.57 cd/A (0.310, 0.648) | 3.11 cd/A (0.564, 0.424) |
| Examples 16-18 | 2.72 cd/A (0.143, 0.184) | 8.4 cd/A (0.290, 0.636) | 2.46 cd/A (0.571, 0.405) |
| Comparative Examples 1-3 | 4.67 cd/A (0.147, 0.147) | 5.42 cd/A (0.236, 0.633) | 1.58 cd/A (0.597, 0.385) |

As illustrated in Table 1, when green light was emitted using the OLED according to the present invention (Examples 1 through 18), both luminance and luminous efficiency showed a significant improvement as compared to a conventional light source, i.e., OLED of Comparative example 1. In particular, when the spectrum half bandwidth was 80 nm or more, e.g., Examples 10 through 18, the OLED emitted cyan light due to the green light dominance in the spectrum despite the blue color filter.

Additionally, as illustrated in Examples 4-7, the use of a light source according to the present invention resulted in blue light having excellent color purity and high efficiency due to an increase in the concentration of the color filter.

It should further be noted that when a light source having a maximum absorption wavelength of 500 nm or more was employed, the relatively intense emission of green light from the light source improved the luminance and efficiency of the blue light, even though the red light transmitted through the red color conversion layer turned orange, i.e., had poor color coordinates, and did not include improved luminance or efficiency.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display device, comprising:
   a substrate;
   an organic light emitting diode including a lower electrode, an upper electrode, and an organic layer interposed between the lower and upper electrodes, the organic layer having only a first emission layer and a second emission layer, the first emission layer being configured to emit only blue light and the second emission layer being configured to emit only green light, the first emission layer being directly on the second emission layer;
   at least one color conversion layer, the color conversion layer only including red color conversion layers and green color conversion layers spaced apart on the organic light emitting diode,
   wherein a blue pixel region is substantially free of the color conversion layer; and
   a color filter, the color filter being disposed only in the blue pixel region.

2. The organic light emitting display device as claimed in claim 1, wherein the first emission layer has a thickness of from about 150 to about 200 angstroms and the second emission layer has a thickness of from about 150 to about 250 angstroms.

3. The organic light emitting display device as claimed in claim 1, wherein the organic light emitting diode is configured to emit cyan light toward the color conversion layer.

4. The organic light emitting display device as claimed in claim 3, wherein the organic light emitting diode is configured to emit cyan light in a spectrum half bandwidth of about 80 nm or less.

5. The organic light emitting display device as claimed in claim 3, wherein the organic light emitting diode is configured to emit cyan light having a maximum emission wavelength of about 420 nm to about 500 nm.

6. The organic light emitting display device as claimed in claim 1, wherein the organic light emitting diode is configured to emit light having color coordinates of about (0.12, 0.15) to about (0.20, 0.30).

7. The organic light emitting display device as claimed in claim 1, further comprising a transparent protective layer disposed on the upper electrode.

8. The organic light emitting display device as claimed in claim 1, further comprising an over-coating layer disposed on the at least one color conversion layer and the color filter.

9. A method of fabricating an organic light emitting display device, comprising:
 obtaining a substrate;
 forming an organic light emitting diode having a lower electrode, an upper electrode, and an organic layer interposed between the lower and upper electrodes, the organic layer having only a first emission layer and a second emission layer, the first emission layer being configured to emit only blue light and a second emission layer configured to emit only green light, the first emission layer being directly on the second emission layer;
 affixing the organic light emitting diode to the substrate;
 depositing at least one color conversion layer on the upper electrode of the organic light emitting diode, the color conversion layer including red color conversion layers and green color conversion layers spaced apart on the organic light emitting diode,
 wherein a blue pixel region is substantially free of the color conversion layer; and
 depositing a color filter on the upper electrode of the organic light emitting diode in a region only corresponding to the blue pixel region of the substrate.

10. The method as claimed in claim 9, wherein forming the organic light emitting diode comprises employing a material configured to emit cyan light.

11. The method as claimed in claim 9, wherein depositing the color filter on the upper electrode comprises depositing the color filter onto a same layer as the at least one color conversion layer.

12. The method as claimed in claim 9, further comprising forming a transparent protective layer on the upper electrode of the organic light emitting diode.

13. The method as claimed in claim 9, further comprising forming an over-coating layer on the at least one color conversion layer and the color filter.

14. The method as claimed in claim 9, wherein the first emission layer is formed to a thickness of about 150 angstroms to about 200 angstroms, and the second emission layer is formed to a thickness of about 150 angstroms to about 250 angstroms.

15. The organic light emitting display device as claimed in claim 9, wherein the first and second emission layers extend in all pixels of the organic light emitting diode.

16. The organic light emitting display device as claimed in claim 2, wherein the thickness of the second emission layer is from about 150 to about 200 angstroms.

17. The method as claimed in claim 14, wherein the thickness of the second emission layer is from about 150 to about 200 angstroms.

* * * * *